(12) United States Patent
Kimura et al.

(10) Patent No.: US 12,085,971 B2
(45) Date of Patent: Sep. 10, 2024

(54) MOS-BASED CURRENT MIRROR CIRCUIT WITH PUSH-PULL AMPLIFIER

(71) Applicant: Morse Micro Pty. LTD., Surry Hills (AU)

(72) Inventors: Hiroyuki Kimura, Surry Hills (AU); Yuanyuan Yang, Surry Hills (AU)

(73) Assignee: Morse Micro Pty. LTD., Surry Hills (AU)

( * ) Notice: Subject to any disclaimer, the term of this patent is extended or adjusted under 35 U.S.C. 154(b) by 192 days.

(21) Appl. No.: 17/884,370

(22) Filed: Aug. 9, 2022

(65) Prior Publication Data

US 2023/0050798 A1    Feb. 16, 2023

(30) Foreign Application Priority Data

Aug. 10, 2021  (AU) ................. 2021902483

(51) Int. Cl.
*G05F 3/26*   (2006.01)
*G05F 1/56*   (2006.01)
*H03F 3/26*   (2006.01)

(52) U.S. Cl.
CPC ............ *G05F 3/262* (2013.01); *G05F 1/56* (2013.01); *H03F 3/265* (2013.01)

(58) Field of Classification Search
CPC ............ G05F 3/262; G05F 1/56; H03F 3/265
See application file for complete search history.

(56) References Cited

U.S. PATENT DOCUMENTS

| | | | | |
|---|---|---|---|---|
| 5,534,817 | A * | 7/1996 | Suzuki | G05F 3/247 327/543 |
| 6,414,552 | B1 * | 7/2002 | Kronmueller | G05F 3/262 330/288 |
| 7,348,810 | B1 * | 3/2008 | Nair | H03F 1/0261 327/108 |
| 2006/0103464 | A1 * | 5/2006 | Kim | H03F 3/3022 330/255 |
| 2010/0244959 | A1 * | 9/2010 | Shibuya | H03F 3/45183 330/253 |
| 2015/0268690 | A1 * | 9/2015 | Lim | H05B 45/397 315/294 |
| 2017/0243108 | A1 * | 8/2017 | Ritter | G05F 3/262 |
| 2017/0286347 | A1 * | 10/2017 | Hinderer | G06F 13/4086 |
| 2019/0081600 | A1 * | 3/2019 | Cevrero | H04B 10/6971 |
| 2019/0179352 | A1 * | 6/2019 | Sakurai | G05F 1/575 |
| 2022/0253083 | A1 * | 8/2022 | Grande | G05F 3/262 |

* cited by examiner

*Primary Examiner* — Rafael O De Leon Domenech (74) *Attorney, Agent, or Firm* — CP LAW GROUP PC; Cy Bates (57) ABSTRACT

The present disclosure provides an electronic circuit having one reference current terminal arranged to connect to a reference current generator, an MOS current mirror stage, an MOS push-pull amplifier stage operatively coupled to the current mirror stage and the current mode amplifier stage.

11 Claims, 11 Drawing Sheets

MOS-BASED CURRENT MIRROR CIRCUIT WITH PUSH-PULL AMPLIFIER

CROSS-REFERENCE TO RELATED APPLICATIONS

This application claims benefit of priority with Australian Provisional Application No. 2021902483, filed Aug. 10, 2021; the entire contents of which are hereby incorporated by reference.

BACKGROUND

Field of the Invention

The invention relates to a Metal-Oxide-Semiconductor (MOS)-based current mirror circuit.

Description of the Related Art

Stable current sources are crucial for analog and digital integrated circuits. In many instances such circuits require a stage powered by a stable current source with a high output impedance, wide voltage swing and stability.

Low-dropout (LDO) voltage regulators, for example, are in common use in power supplies for electronic circuits and require very stable current sources.

SUMMARY

In accordance with a first aspect, the present invention provides, an electronic circuit comprising a reference current terminal arranged to connect to a reference current generator, an MOS current mirror stage, an MOS push-pull amplifier stage operatively coupled to the MOS current mirror stage, and a current mode amplifier stage.

In an embodiment, the MOS current mirror stage comprises a reference MOS device and one or more mirroring MOS devices, wherein the one or more mirroring MOS devices each comprise an equal gate to source voltage.

In an embodiment, the MOS current mirror stage comprises a first pair of MOS devices being a first MOS device and a second MOS device in a current mode configuration, wherein a source of the first MOS device being connected to a drain of the reference MOS device and a source of the second MOS device being connected to one or more drains of the one or more mirroring MOS devices.

In an embodiment, the MOS push-pull amplifier stage comprises two additional pairs of MOS devices (Mn1, Mn2, Mn4, Mp5) arranged in a push-pull configuration.

In an embodiment, the MOS push-pull amplifier stage is configured to set a voltage of the drain of the reference MOS device.

In an embodiment, the MOS push-pull amplifier stage is configured to set a voltage of the one or more drains of the one or more mirroring MOS devices.

In an embodiment, the two additional pairs of MOS devices are configured as a bottom pair of MOS and a top pair of MOS with a drain of each of the bottom pair of MOS being connected to a drain of a respective MOS of the top pair of MOS.

In an embodiment, the drain of each of the bottom pair of MOS is connected to a gate of the second MOS device of the MOS current mirror stage.

In an embodiment, a source of one of the top pair of MOS (Mp4) is connected to the drain of the reference MOS device, and a source of another of the top pair of MOS (Mp5) is connected to the one or more drains of the mirroring MOS devices.

In an embodiment, the MOS push-pull amplifier stage comprises six MOS devices arranged in a push-pull configuration.

In an embodiment, further comprising a pair of PMOS transistors configured as current mirrors.

In an embodiment, the six MOS devices are configured as two bottom pairs of MOS and a top pair of MOS with a drain of one MOS device for each of the bottom pairs of MOS being connected to a drain of a respective MOS device of the top pair of MOS and a drain of another MOS device of each of the bottom pairs of MOS being connected to a drain of a respective PMOS of the pair of PMOS transistors configured as current mirrors.

In accordance with a second aspect, the present invention provides a method for configuring an electronic circuit comprising the steps of (i) providing an MOS current mirror stage, (ii) providing a current mode amplifier stage operatively coupled to the MOS current mirror stage, (iii) providing an MOS push-pull amplifier stage operatively coupled to the current mirror stage and the current mode amplifier stage, wherein when a reference current generator is connected to a reference current terminal of the circuit, a current with a magnitude which is a multiple of the reference current of the generator is provided at an output terminal of the MOS current mirror stage.

Advantages of embodiments of the invention include an improved output impedance and output voltage swing, which is achieved without the use of an operational amplifier. In addition, the circuit requires only a single reference current source and provides a scalable output current. Some embodiments also provide an improved sensitivity to supply voltage variations.

BRIEF DESCRIPTION OF THE DRAWINGS

For proper understanding of the invention, reference should be made to the accompanying drawings, wherein.

DETAILED DESCRIPTION OF THE INVENTION

The present disclosure provides an improved MOS-based electronic circuit. The circuit is used to mirror a reference current from a reference current input terminal to a high impedance current output terminal. The circuit could be used, for example, as an element of a $G_m$ stage of a LDO circuit.

For purposes herein, the term "MOS" means Metal-Oxide-Semiconductor transistor.

The term "reference current terminal" mean a circuit terminal arranged to be connected to a reference current source.

The term "reference current generator" means a circuit with an output arranged to provide a current which is stable for a wide range of loads.

The term "MOS current mirror stage" means a mirror circuit configuration arranged to replicate a reference current and comprising a plurality of MOS transistors.

The term "MOS push-pull amplifier stage" means a circuit that uses a pair of MOS transistors to alternately supply current to, or absorb current from, a connected load.

The term "current mode amplifier stage" means a circuit comprising a plurality of MOS transistors arranged in current mode configuration.

The term "reference MOS device" in an MOS current mirror means the MOS transistor directly connected to the reference current generator.

The term "mirroring MOS device" in a MOS current mirror means the MOS transistor mirroring the current flowing in the reference MOS transistor.

The term "MOS device" means Metal-Oxide-Semiconductor transistor.

Figure 1:
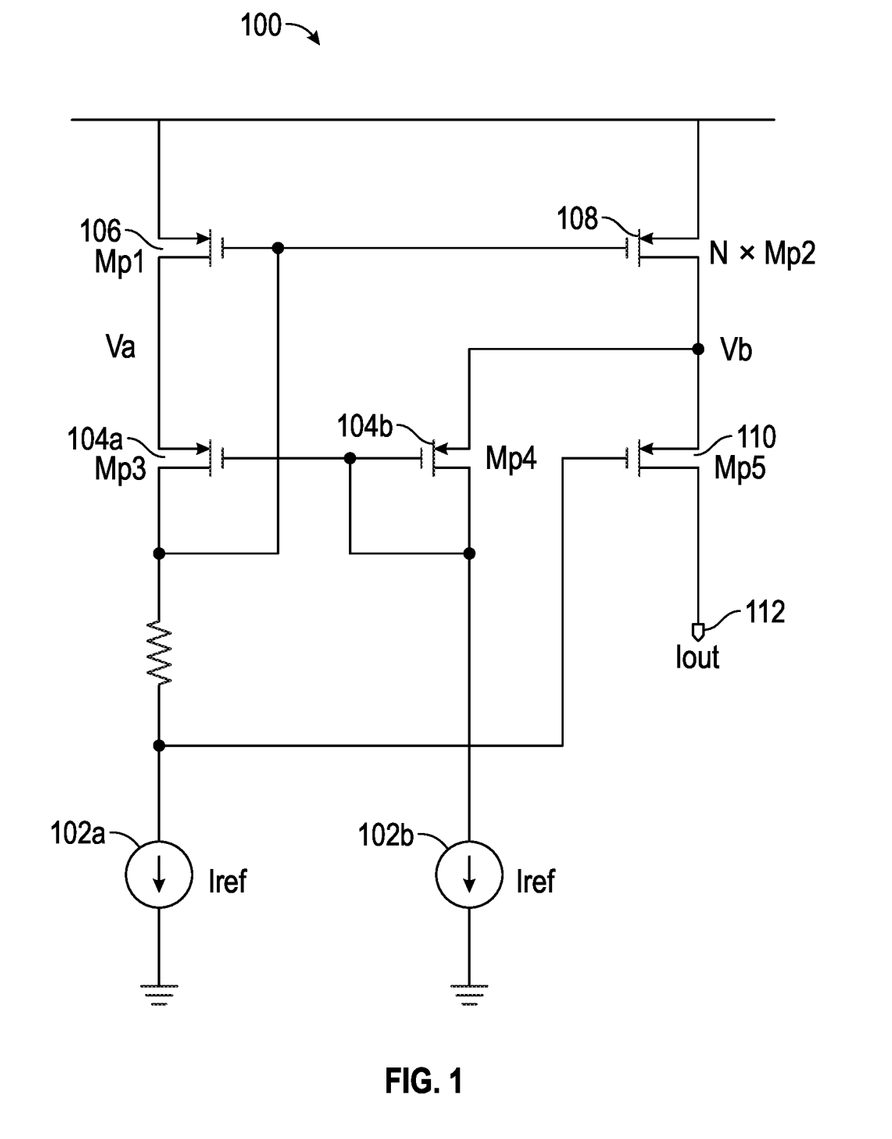
FIG. 1 shows a current mirror circuit known in the art.

Referring now to FIG. 1, there is shown an example of current mirror circuit 100 with a high output resistance as known in the art. Other mirror configurations also exist in the art.

The circuit 100 uses two separate current sources 102a, 102b that send a current through a matched pair of MOS transistors 104a, 104b. The matched transistors 104a, 104b lock the voltages $V_a$ and $V_b$ to be similar.

The reference current 102a also flows through MOS transistor 106 setting the gate voltages of NxMOS transistors 108 which, therefore, replicate the value of current of the two current sources 102a and 102b at their drain terminal. The number of transistors N 108 determines the current flowing through transistor 110 and, therefore, through the output terminal.

One of the drawbacks with circuit 100 is that it requires two 'ideal' reference current sources. Generally, a high output resistance is desired at the output terminal of this type of circuit. The output resistance seen by a load connected to the output terminal of circuit 100 is proportional to the transconductance and the output resistance of MOSFETs Mp3 208a and Mp4 210e (gm$_3$rds$_3$, gm$_4$rds$_4$).

Figure 2:
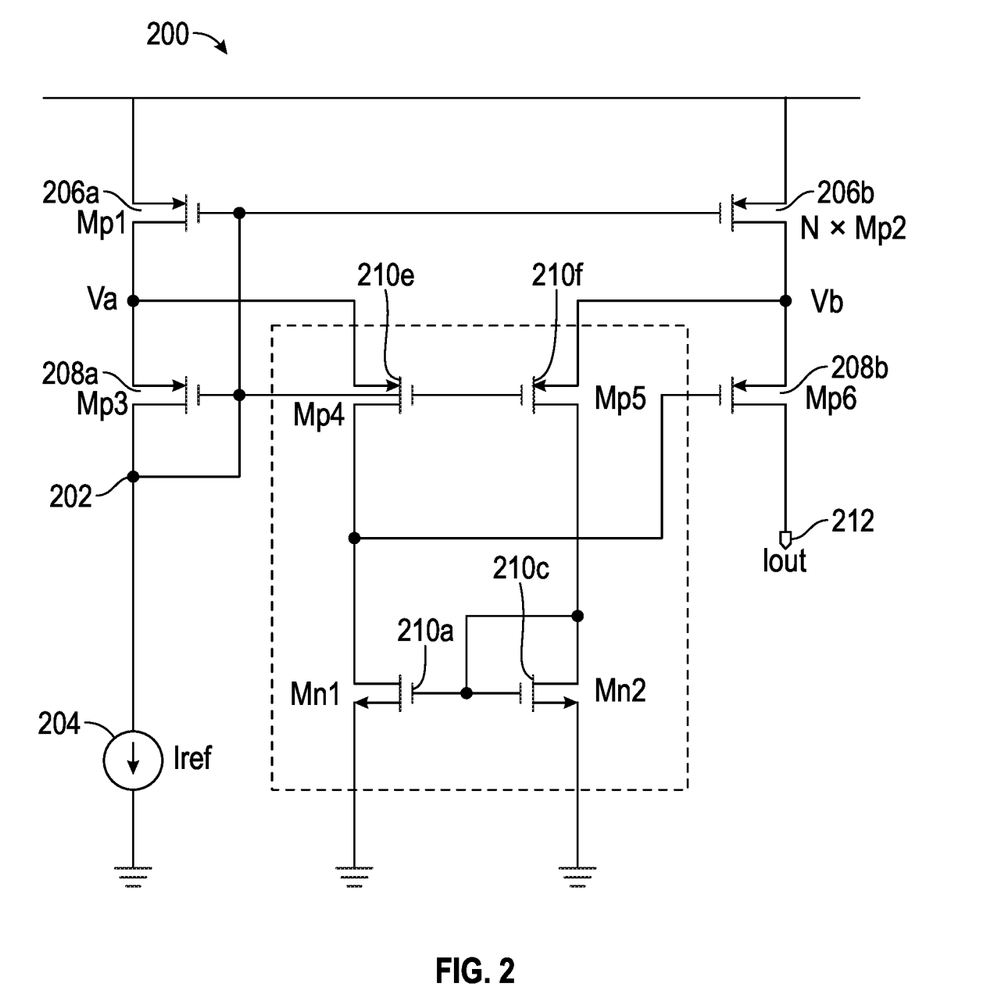
FIG. 2 shows a diagram of an MOS-based electronic circuit according to a first illustrated embodiment.

Referring now to FIG. 2, there is shown an example of electronic circuit 200 in accordance with embodiments. The circuit 200 comprises one reference current terminal 202 arranged to connect to a reference current generator 204; a current mirror stage consisting of reference PMOS Mp1 206a and mirroring PMOS Mp2 206b; PMOS Mp3 208a and Mp6 208b setup in a current mode configuration; and four MOS setup in a push-pull amplifier configuration: NMOS Mn1 210a and Mn2 210c and PMOS Mp4 210e and Mp5 210f.

The input reference current $I_{ref}$ 204, flows through MOS Mp3. The current in MOS Mp1 ($I_{Mp1}$) is equal to the current in MOS Mp3 ($I_{ref}$) plus the current in MOS Mp4 ($I_{Mp4}$). Assuming that Mp3, Mp4, Mp5 and Mp1 are identical MOS, $I_{Mp4} \approx I_{Mp3}$ ($I_{Mp4} \approx I_{ref}$), $I_{Mp1} \approx 2I_{ref}$.

Assuming that Mn1 and Mn2 have the same transconductance parameter as for Mp3, Mp4, Mp5 and Mp1, in steady-state, the current in Mn1 and Mn2 is about the same, as these two MOS operate in saturation and have the same $V_{GS}$. $I_{Mn1} = I_{Mn4} \approx I_{Mn2} = I_{Mn5} \approx I_{ref}$.

The MOS current mirror stage 206 requires that the current in MOS Mp1 and mirroring MOS Mp2 are equal. If N mirroring MOS Mp2 are used, $I_{Mp2} = NI_{Mp1} \approx 2N\ I_{ref}$. Finally, the current in MOS Mp6 is $I_{Mp6} = I_{out} = I_{Mp2} - I_{Mp5} = 2NI_{ref} - I_{Mn2} = (2N-1)\ I_{ref}$. In some embodiments a number of MOS Mp6 is also used to match N (MP2). This calculation assumes $V_a = V_b$ and the same form factors for all MOSFETs. The output resistance seen by a load connected to the output terminal creates a variation of current at the output for a dynamic variation of the output voltage:

$$\Delta i_{out} = \Delta v_{out}/r_o$$

If $v_{out}$ increases, $v_b$ also increases, increasing the $v_{GS}$ of Mp5 and therefore $I_{Mp5}$.

Voltage of node 202 is defined by a diode connected MOS device bias point, in this case, half of Mp1 and Mp3 work as a combined single MOS device.

Another way to look at the DC operating point for the circuit 200 of FIG. 2 is to consider $V_a$ is defined by a diode connected to MOS device of Mp3 and $V_b$ controlled to be close to $V_a$. When on, Mn2 can be seen as a diode connected MOS device. The gate voltage of Mp6 varies from ground level to a value close to $V_a$, depending on the output voltage of node $I_{out}$.

Such current increase is replicated in $I_{Mp4}$ pushing the gate voltage of Mp6 down and therefore increasing the $v_{GS}$ of Mp6. Such a current increase is also seen in Mn2 and is mirrored to Mn2. As the $V_a$ voltage remains constant, Mp4 sources a constant current. The node voltage at the drain of Mn1, which is also the gate voltage of Mp6 will decrease. Mp6 is in source follower configuration, the source voltage thus decreases following the gate voltage. Overall, the circuit will bring back (maintain) the $V_b$ node voltage in a negative feedback way and thus at the output node shows a high output impedance.

The increase in the $v_{GS}$ of Mp6 provided an increase in $i_{out}$ that compensates for the increase in $v_{out}$ maintaining the value of $r_o$ at the output node. The fixed value of $V_b$ allows for an improved swing at the output ($V_b - I_{out}r_{ds6}$). Nominally the power used by the circuit is $P_{circuit} = V_{DD}\ (3I_{ref} + I_{out})$. The power can be reduced if Mp4 and Mp5 are smaller than Mp3. The circuit allows for good stability by providing an improved phase margin. This is due to the operational amplifier-like (OpAmp) structure formed by Mp4, Mp5, Mn1 and Mn2, which acts as a single pole amplifier basically followed by a 0 dB buffer stage, Mp6, having a pole at much higher frequency than the OpAmp.

The circuit 200 of FIG. 2 has a push-pull gate drive circuit so when the voltage at the output 212 increases or decreases rapidly, the current from Mp4 or Mn1 responds quickly to the output current change. The circuit 200 also provides a fast response when the input current $I_{ref}$ changes rapidly. This is due to the internal OpAmp being connected to the circuit points close to $I_{ref}$ or $I_{out}$ circuit. The interconnection of the reference current and the output current to reference voltage points $V_a$ and $V_b$ creates a control path through the biasing point of Mp1 and Mp2. In some applications, the circuit providing the reference current may not be in close proximity to the current mirror circuit. In this case, the parasitic capacitance at the gates of Mp1 and Mp2 may be large. The output circuit, however, is not greatly affected because the gate of Mp6 as a control node is independent of the parasitic capacitance.

Figure 3:
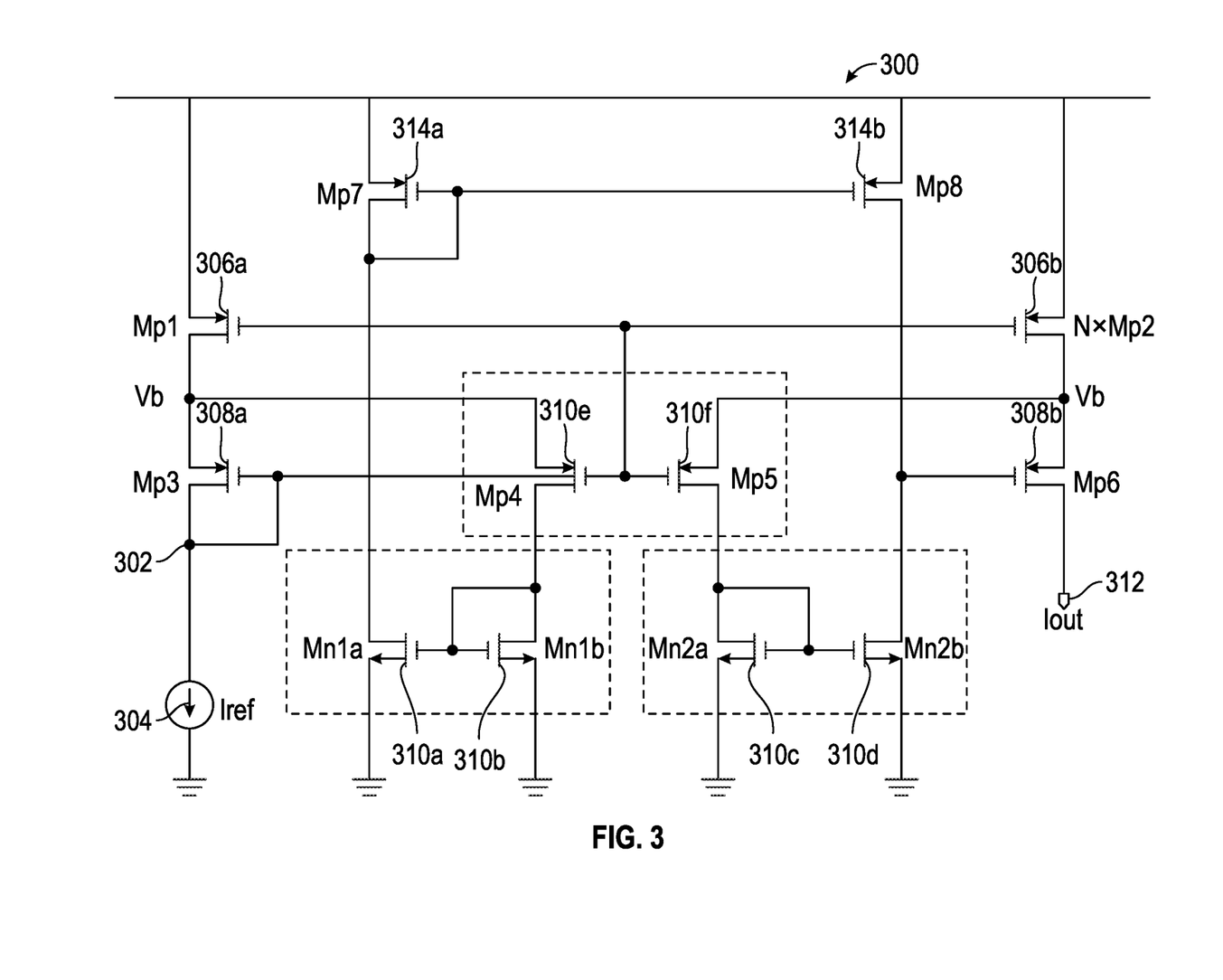
FIG. 3 shows a diagram of an MOS-based electronic circuit according to a second illustrated embodiment.

Referring now to FIG. 3, there is shown another MOS-based electronic circuit 300 in accordance with embodiments. In this instance, the circuit 300 provides an alternative configuration of the push-pull amplifier (dotted lines) and the addition of PMOS transistors Mp7 314a and Mp8 314b.

The circuit 300 comprises one reference current terminal 302 arranged to connect to a reference current generator 304; a current mirror stage consisting of reference PMOS Mp1 306a and mirroring PMOS Mp2 306b; PMOS Mp3 308a and Mp6 308b setup in a current mode configuration; and six MOS setup in a push-pull amplifier configuration: a first bottom pair NMOS Mn1a 310a, Mn1b 310b, a second bottom pair Mn2a 310c, Mn2b 310d, and a top pair PMOS Mp4 310e, Mp5 310f.

The circuit also comprises another pair of PMOS Mp7 314a and Mp8 314b transistors configured as secondary current mirror.

In embodiments, the six MOS devices are configured as two bottom pairs of MOS Mn1a 310a, Mn1b 310b and Mn2a 310c, Mn2b 310d; a top pair of MOS Mp4 310e, Mp5 310f The drain of one MOS for each of the bottom pairs is connected to the drain of a respective MOS of the top pair and the drain of the other MOS of each of the bottom pair is connected to the drains of a respective PMOS of the pair of PMOS transistors configured as secondary current mirrors. More specifically, the drain Mn1b 310b is connected to the drain of Mp4 310e, the drain of Mn2a 310c is connected to the drain of Mp5 310f, the drain of Mn1a 310a is connected to the drain of Mp7 314a and the drain of Mn2b 310d is connected to the drain of Mp8 314b.

The advantage of the configuration 300 of FIG. 3 is the improved stability of the output with respect to variation of the power supply voltage.

The output resistance seen by a load connected to the output terminal creates a variation of current at the output for a dynamic variation of the output voltage:

$$\Delta i_{out} = \Delta v_{out}/r_o$$

If $v_{out}$ increases, $v_b$ also increases, increasing the $v_{GS}$ of Mp5 and therefore $i_{Mp5}$.

$V_a$ can be treated as a reference node, thus the currents in Mp4, Mn1b, Mn1a and Mp7 remain constant. If $v_{out}$ increases, $v_b$ also increases, increasing the $v_{gs}$ of Mp5 and therefore $i_{Mp1}$. This small signal current goes through Mn2a and is mirrored to Mn2b. As the $i_{Mp8}$ is constant, the mirrored small signal current $i_{Mn2b}$ will bring down the gate voltage of Mp6 reducing the value of $v_{out}$ and therefore keeping $r_{out}$ high.

Figure 4:
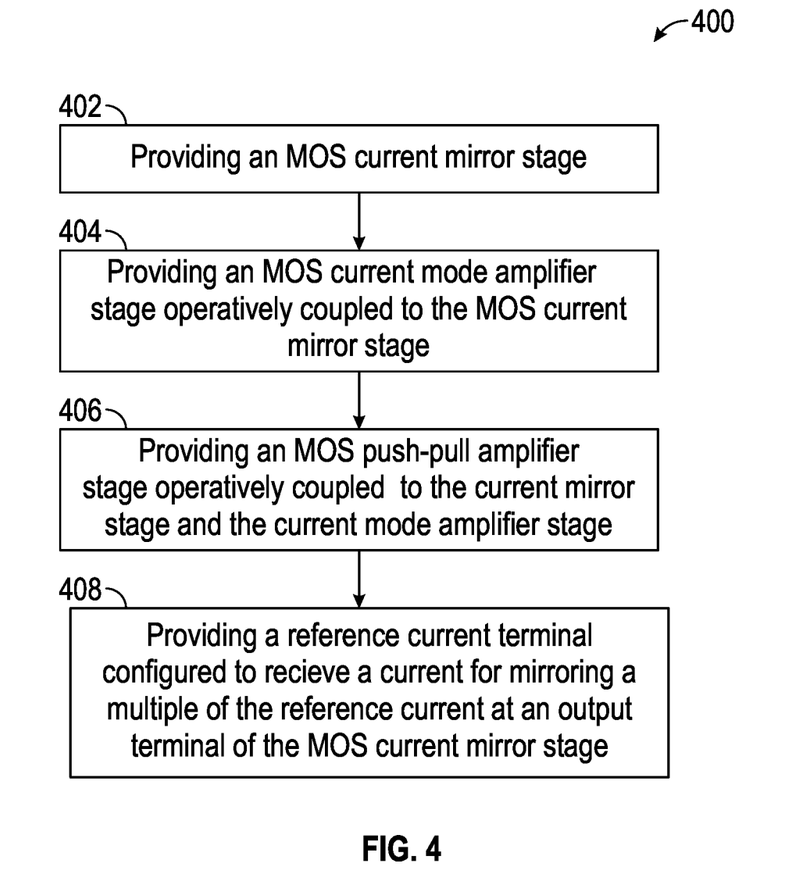
FIG. 4 shows a schematic block diagram with steps for configuring a MOS-based electronic circuit in accordance with the embodiments.

FIG. 4 shows a schematic block diagram with the method steps for configuring a MOS-based electronic circuit in accordance with embodiments. An MOS-based current mirror stage is provided 402. An MOS current mode amplifier stage operatively coupled to the MOS current mirror stage is provided 404.

Further, an MOS push-pull amplifier stage operatively coupled to the current mirror stage and the current mode amplifier stage 406. Finally, a reference current terminal configured to receive a current for mirroring a multiple of the reference current at an output terminal of the MOS current mirror stage 408.

Figure 5A:
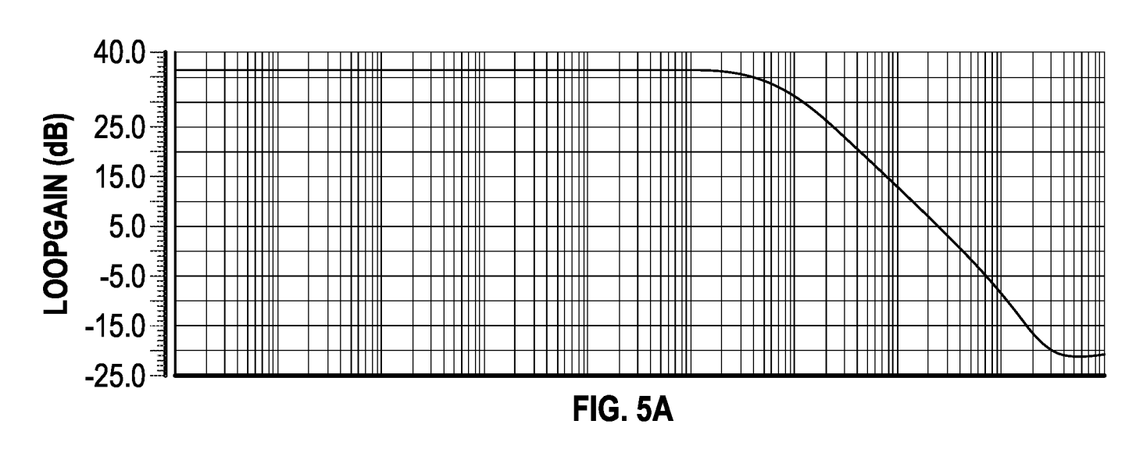
FIG. 5A shows a diagram of frequency and LOOPGAIN (dB) outlining performance of the current mirror circuits in accordance with the embodiments.
Figure 5B:
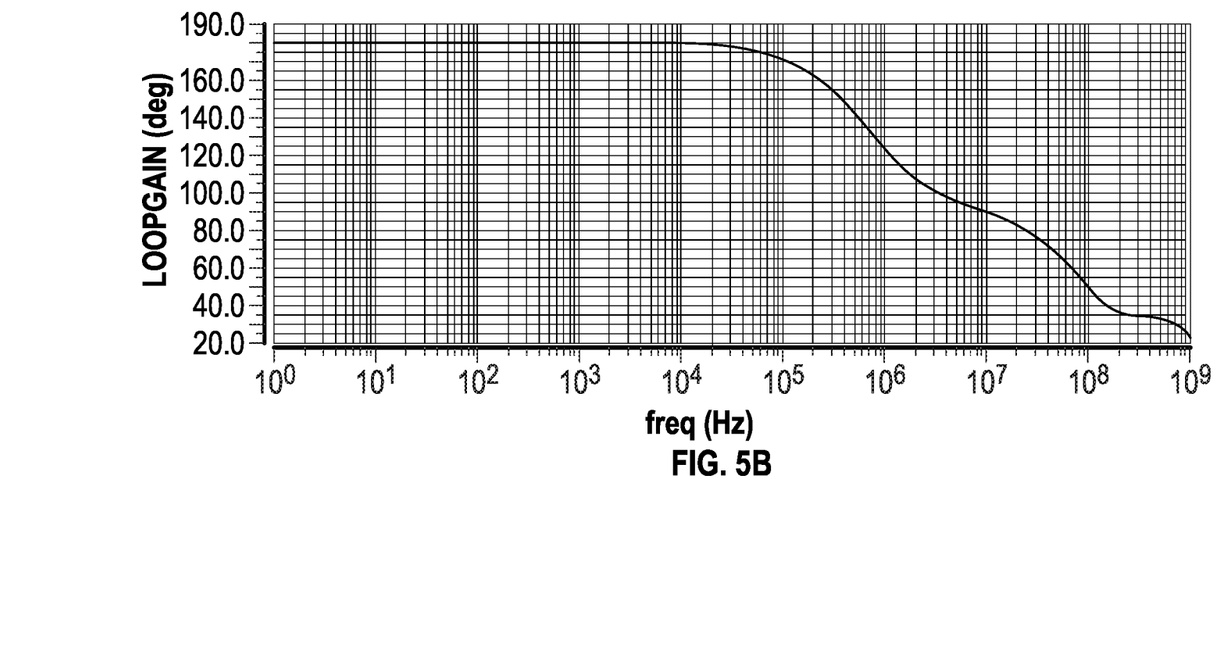
FIG. 5B shows a diagram of frequency and LOOPGAIN (deg) outlining performance of the current mirror circuits in accordance with the embodiments.

FIG. 5 shows a comparison of the stability simulation curves for the embodiments described with reference to FIG. 2 (full line) and FIG. 3 (dashed line). All PMOS and NMOS transistors in the simulation have an identical form factor of 8μ/1μ. Both circuits have been simulated with $V_{dd}$=1.8V and a phase margin of about 70 dB.

Figure 6:
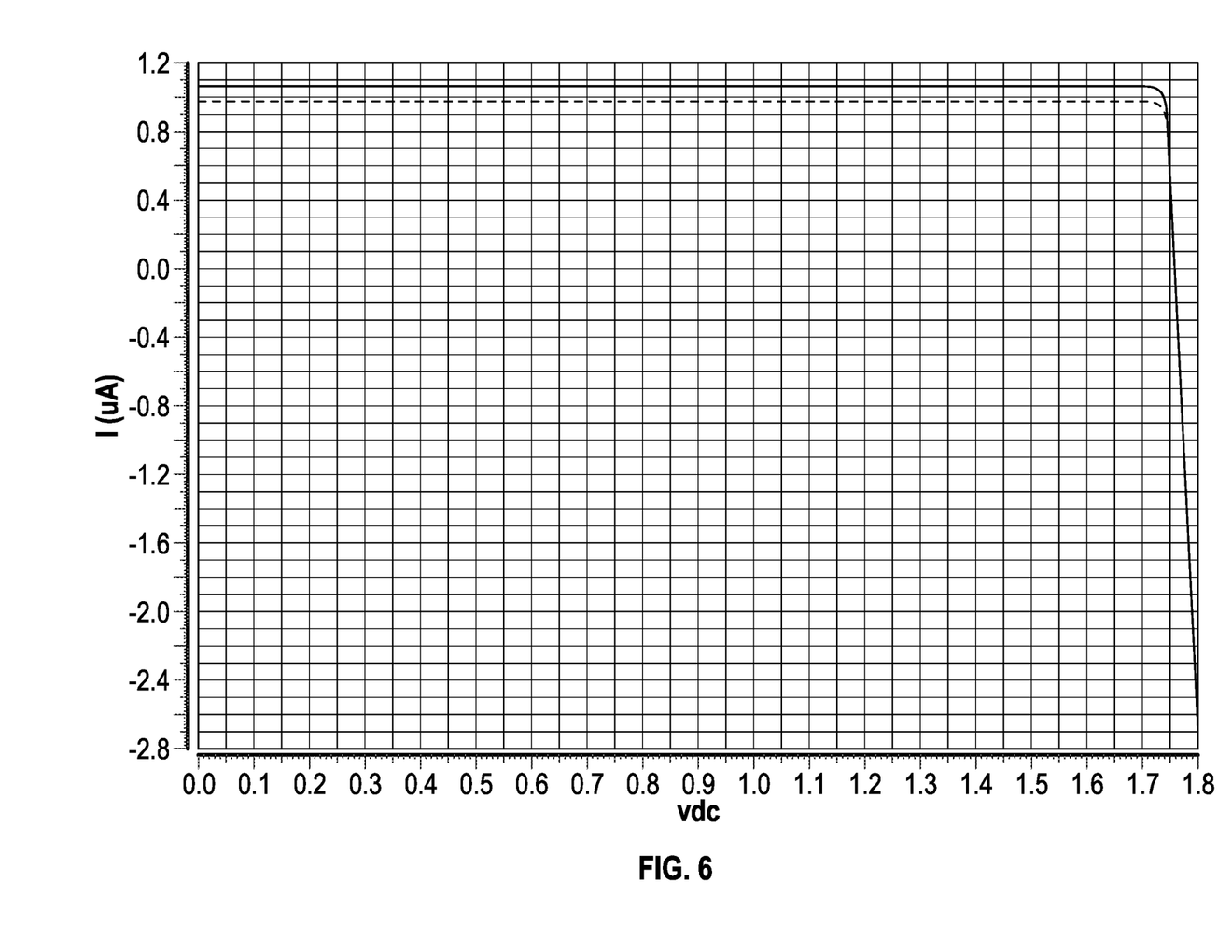
FIG. 6 shows a diagram of vdc and current outlining performance of the current mirror circuits in accordance with the embodiments.

FIG. 6 shows a diagram of the value of the DC output current with respect to the DC output voltage for the embodiments described with reference to FIG. 2 (full line) and FIG. 3 (dashed line). Both circuits have been simulated with $V_{dd}$=1.8V while sweeping the output voltage value.

Figure 7:
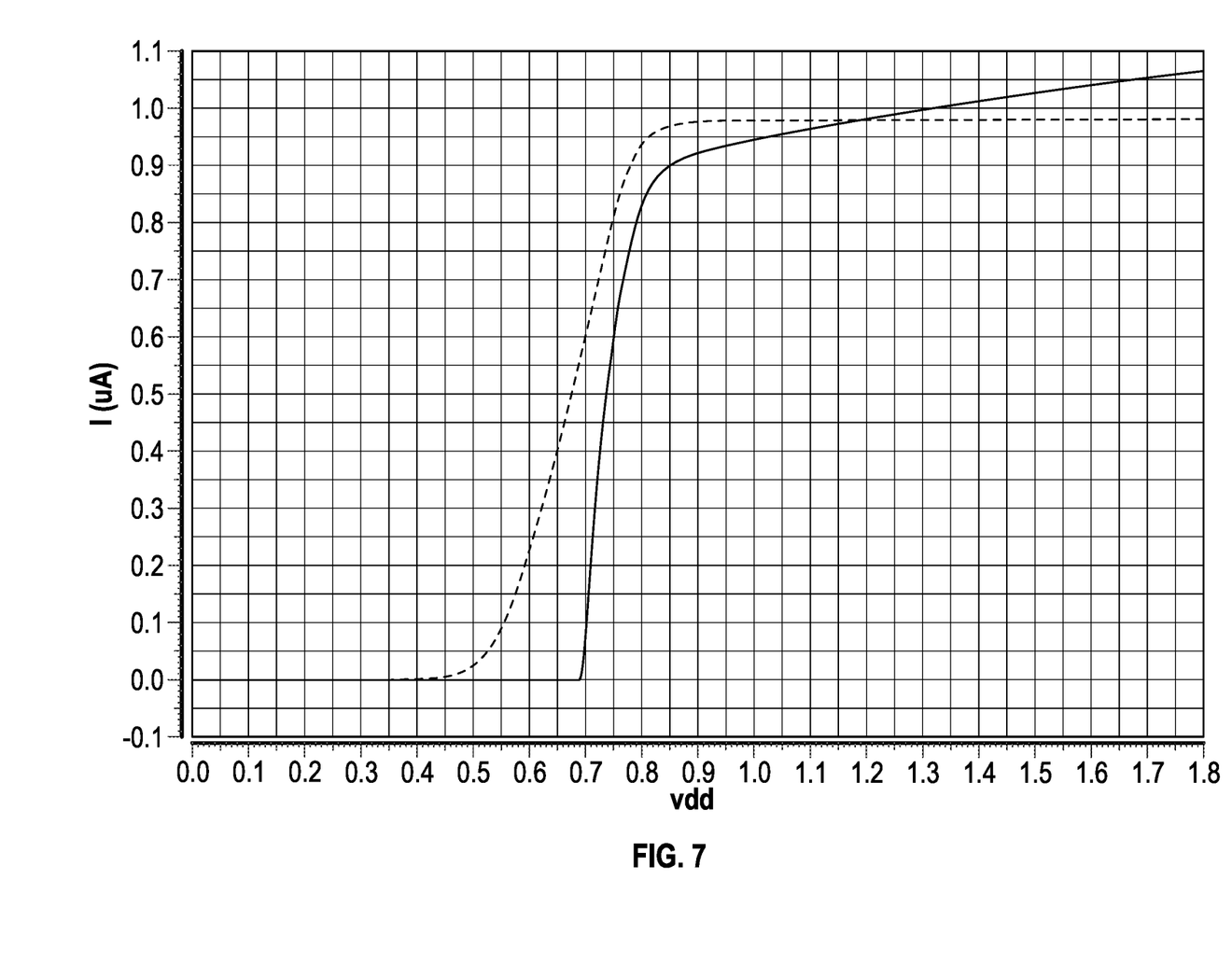
FIG. 7 shows a diagram of vdd and current outlining performance of the current mirror circuits in accordance with the embodiments.

FIG. 7 shows the behavior of the output current with respect to changes of the supply voltage for the embodiments described with reference to FIG. 2 (full line) and FIG. 3 (dashed line). The circuits have been simulated using 0V output voltage. Both circuits begin to stabilize at around 0.9V.

Figure 8:
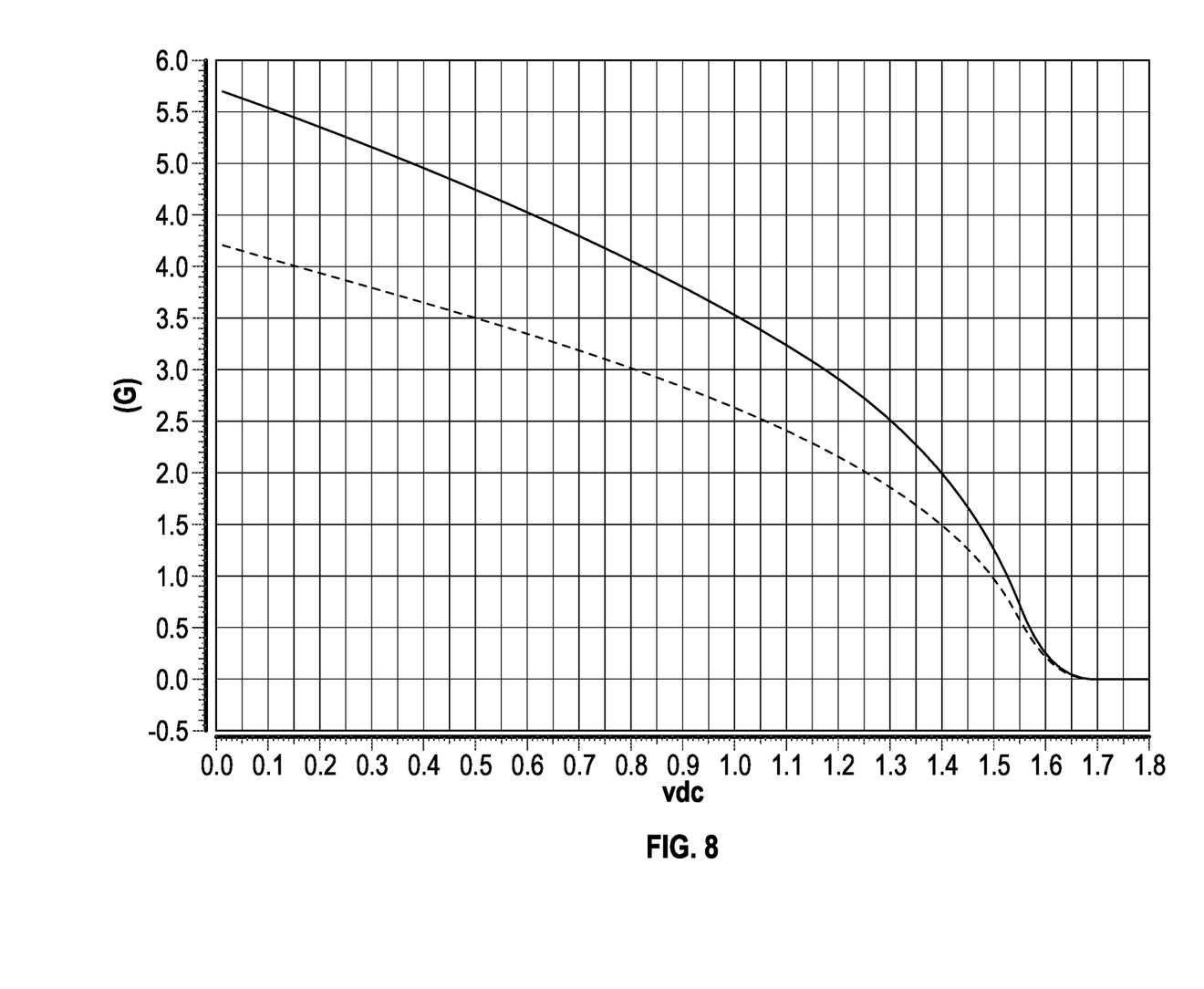
FIG. 8 shows a diagram of vdc and gain outlining performance of the current mirror circuits in accordance with the embodiments.

FIG. 8 shows the circuits output impedance vs the output voltage. Both circuits have been simulated with $V_{dd}$=1.8V while sweeping the output voltage source value and monitoring the current through the voltage source.

Figure 9:
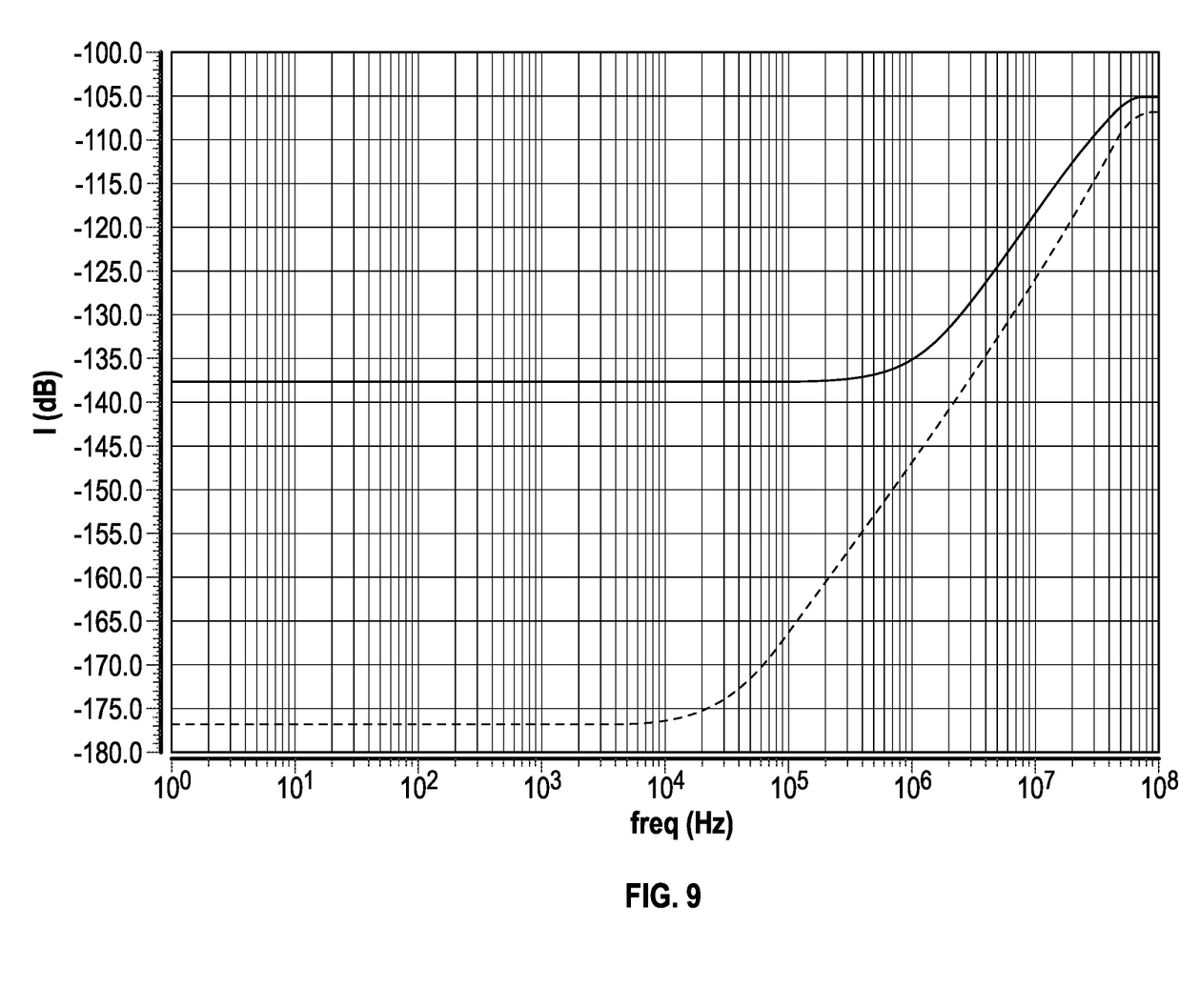
FIG. 9 shows a diagram of frequency and I (dB) outlining performance of the current mirror circuits in accordance with the embodiments.

FIG. 9 shows a comparison of the power supply rejection ratio (PSRR) for both embodiments described with reference to FIG. 2 (full line) and FIG. 3 (dashed line). $\Delta i_{out}/\Delta v_{dd}$ was simulated for $V_{dd}$=1.8V and $V_{out}$=0.5V. In FIG. 9, −120 dB, for example, means 1 μA output current change for 1V variation of supply voltage ($V_{dd}$).

Figure 10:
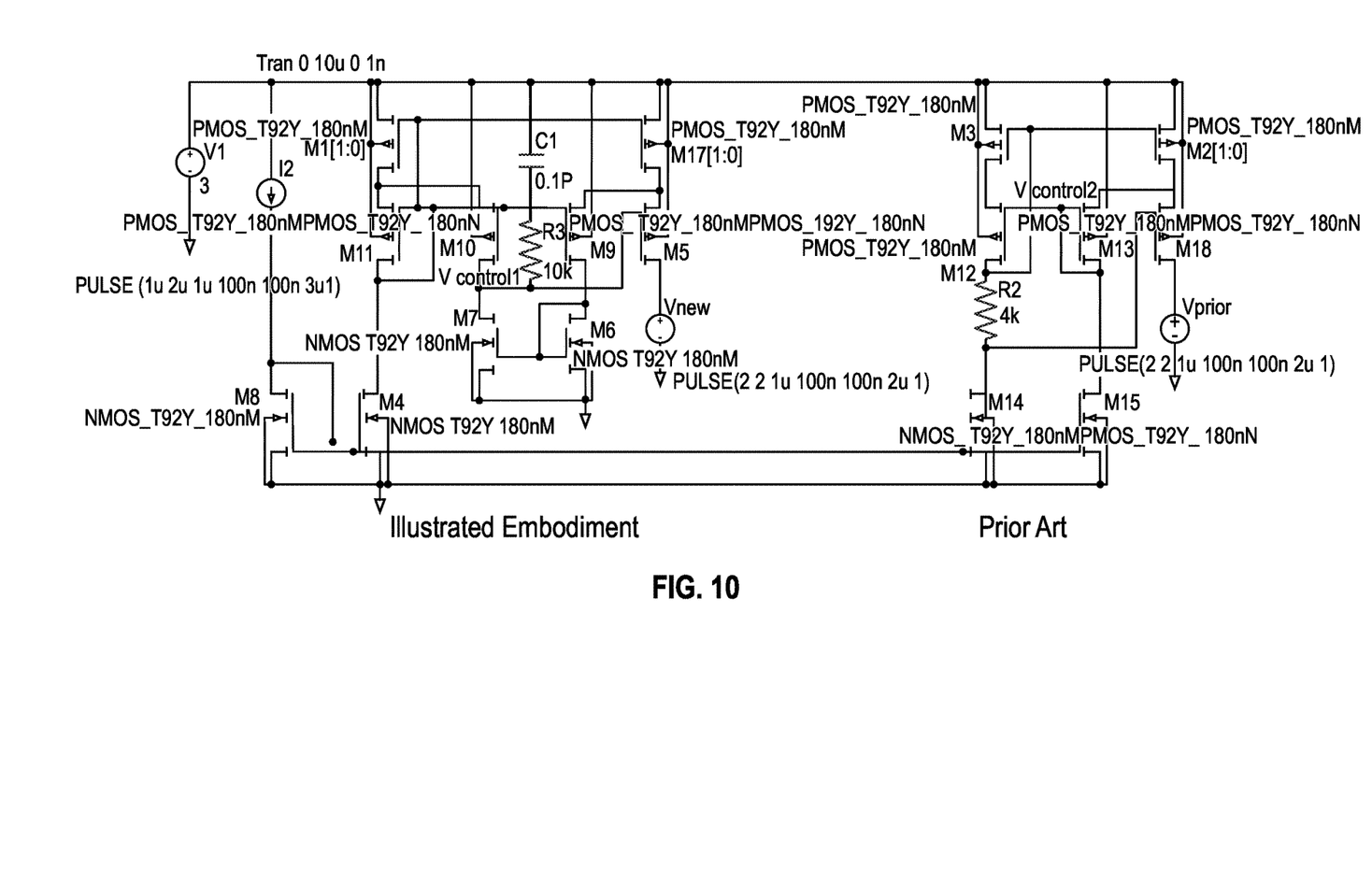
FIG. 10 shows steady state simulations current values for a current mirror used in the prior art (right hand side) and a current mirror in accordance with an illustrated embodiment (left hand side)
Figure 11:
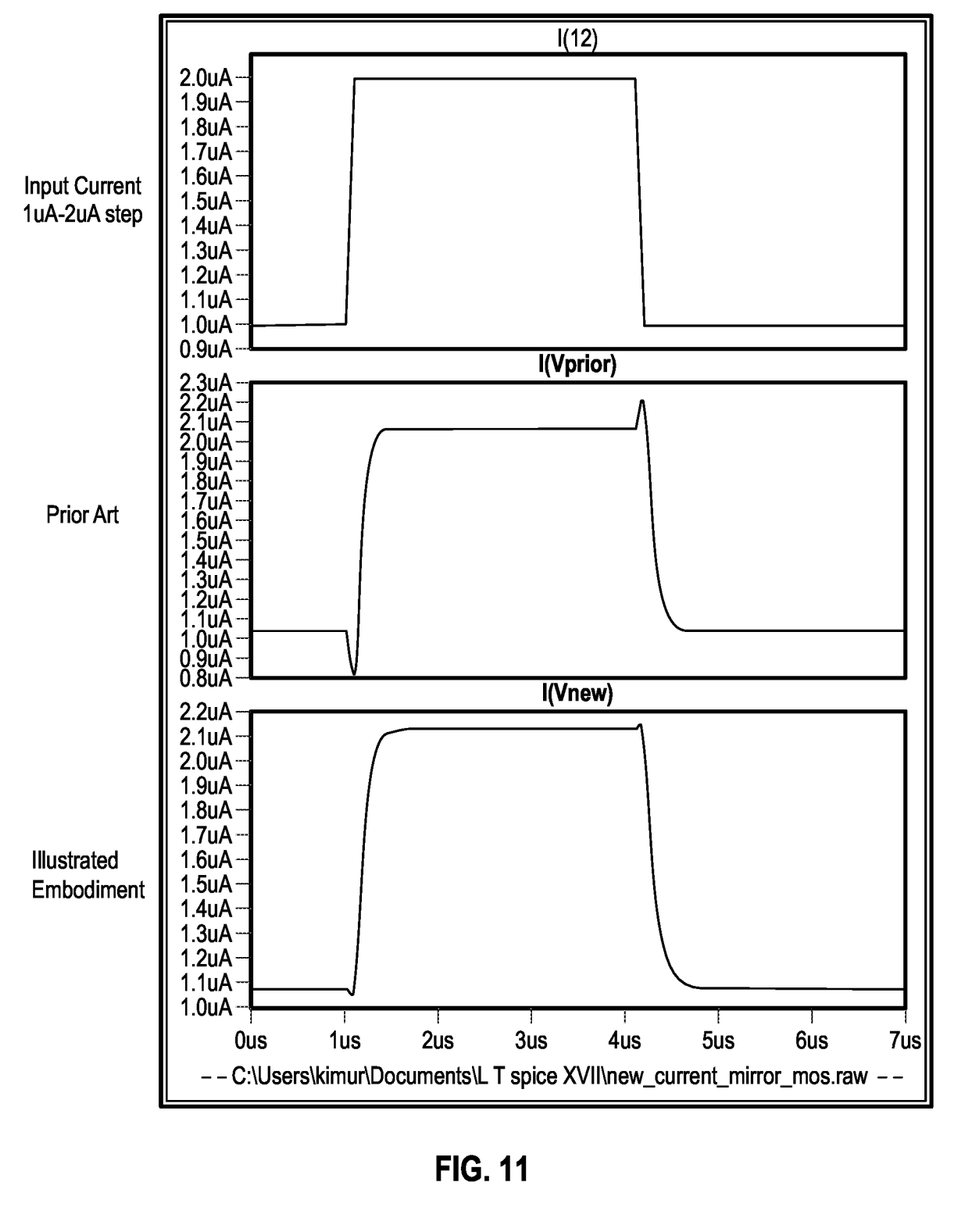
FIG. 11 shows a comparison of the output current transients for the two current mirrors of FIG. 10.

FIG. 10 shows steady state simulations current values for a current mirror used in the prior art (right hand side) and a current mirror in accordance with an illustrated embodiment (left hand side);

FIG. 11 shows a comparison of the output current transients for the two current mirrors of FIG. 10;

Although the invention is illustrated and described herein with reference to specific embodiments, the invention is not intended to be limited to the details shown. Rather, various modifications may be made in the details within the scope and range of equivalents of the claims and without departing from the invention.

It is to be understood that the above description is illustrative of the invention and is not to be construed as limiting the invention. Various modifications, applications and/or combinations of the embodiments may occur to those skilled in the art without departing from the scope of the invention as defined by the claims.

One having ordinary skill in the art will readily understand that the invention as discussed above may be practiced with hardware elements in configurations which are different than those which are disclosed. Therefore, although the invention has been described based upon these preferred embodiments, it would be apparent to those skilled in the art that certain modifications, variations, and alternative constructions would be apparent, while remaining within the scope of the invention.

Although the invention has been described with reference to a preferred embodiment, it will be appreciated by persons skilled in the art that the invention may be embodied in many other forms and numerous variations and/or modifications may be made to the technology as shown in the specific embodiments without departing from the spirit or scope of technology as broadly described. The present embodiments are, therefore, to be considered in all respects as illustrative and not restrictive.

Throughout this specification, unless the context clearly requires otherwise, the word "comprise", or variations such as "comprises" or "comprising", will be understood to imply the inclusion of a stated element, integer or step, or group of elements, integers, or steps, but not the exclusion of any other element, integer or step, or group of elements, integers, or steps.

Any discussion of documents, acts, materials, devices, articles or the like which has been included in the present specification is solely for the purpose of providing a context for the present technology. It is not to be taken as an admission that any or all these matters form part of the prior art base or were common general knowledge in the field relevant to the present technology as it existed before the priority date of each claim of this specification.

What is claimed is:

1. An electronic circuit comprising:
    a reference current terminal arranged to connect to a reference current generator;
    an MOS current mirror stage; and
    an MOS push-pull amplifier stage operatively coupled to the MOS current mirror stage and a current mode amplifier stage;
    wherein the MOS current mirror stage comprises a reference MOS device and one or more mirroring MOS devices, wherein the MOS current mirror stage comprises a first pair of MOS devices being a first MOS device and a second MOS device in a current mode configuration, wherein a source of the first MOS device being connected to a drain of the reference MOS device and a source of the second MOS device being connected to one or more drains of the one or more mirroring MOS devices.

2. The circuit of claim 1, wherein the one or more mirroring MOS devices each comprise an equal gate to source voltage.

3. The circuit of claim 1, wherein the MOS push-pull amplifier stage comprises two additional pairs of MOS devices (Mn1, Mn2, Mn4, Mp5) arranged in a push-pull configuration.

4. The circuit of claim 3, wherein the MOS push-pull amplifier stage is configured to set a voltage of the drain of the reference MOS device.

5. The circuit of claim 3, wherein the MOS push-pull amplifier stage is configured to set a voltage of the one or more drains of the one or more mirroring MOS devices.

6. The circuit of claim 3, wherein the two additional pairs of MOS devices are configured as a bottom pair of MOS and a top pair of MOS with a drain of each of the bottom pair of MOS being connected to a drain of a respective MOS of the top pair of MOS.

7. The circuit of claim 6, wherein the drain of each of the bottom pair of MOS is connected to a gate of the second MOS device of the MOS current mirror stage.

8. The circuit of claim 6, wherein a source of one of the top pair of MOS (MP4) is connected to the drain of the reference MOS device, and a source of another of the top pair of MOS (MP5) is connected to the one or more drains of the mirroring MOS devices.

9. The circuit of claim 1, wherein the MOS push-pull amplifier stage comprises six MOS devices arranged in a push-pull configuration.

10. The circuit of claim 9, further comprising a pair of PMOS transistors configured as current mirrors.

11. The circuit of claim 10, wherein the six MOS devices are configured as two bottom pairs of MOS and a top pair of MOS with a drain of one MOS device for each of the bottom pairs of MOS being connected to a drain of a respective MOS device of the top pair of MOS and a drain of another MOS device of each of the bottom pairs of MOS being connected to a drain of a respective PMOS of the pair of PMOS transistors configured as current mirrors.

* * * * *